(12) United States Patent
Loglisci

(10) Patent No.: US 9,341,654 B2
(45) Date of Patent: May 17, 2016

(54) MIXED CURRENT SENSOR AND METHOD FOR FITTING SAID SENSOR

(71) Applicant: Schneider Electric Industries SAS, Rueil Malmaison (FR)

(72) Inventor: David Loglisci, Uriage (FR)

(73) Assignee: SCHNEIDER ELECTRIC INDUSTRIES SAS, Rueil Malmaison (FR)

( * ) Notice: Subject to any disclaimer, the term of this patent is extended or adjusted under 35 U.S.C. 154(b) by 229 days.

(21) Appl. No.: 13/887,696

(22) Filed: May 6, 2013

(65) Prior Publication Data

US 2013/0314083 A1 Nov. 28, 2013

(30) Foreign Application Priority Data

May 21, 2012 (FR) ...................... 12 01432

(51) Int. Cl.
*G01R 19/00* (2006.01)
*G01R 15/18* (2006.01)
*H01F 38/30* (2006.01)
(Continued)

(52) U.S. Cl.
CPC ...... *G01R 19/00* (2013.01); *G01R 3/00* (2013.01); *G01R 15/181* (2013.01); *H01F 38/30* (2013.01); *G01R 15/207* (2013.01); *G01R 19/0092* (2013.01); *G01R 33/0047* (2013.01); *G01R 33/02* (2013.01); *Y10T 29/4913* (2015.01)

(58) Field of Classification Search
CPC .. G01R 33/02; G01R 15/207; G01R 33/0047; G01R 19/092; G01V 20/30
USPC .................................................. 324/244, 227
See application file for complete search history.

(56) References Cited

U.S. PATENT DOCUMENTS 2,912,481 A * 11/1959 Backus ............... H01F 5/04
178/2 R
2,964,722 A * 12/1960 Peterson ............. H01F 27/40
336/192

(Continued)

FOREIGN PATENT DOCUMENTS

DE 195 05 812 A1 8/1996
FR 2 538 120 A1 6/1984
FR 2 839 382 A3 11/2003

OTHER PUBLICATIONS

French Preliminary Search Report issued Mar. 14, 2013 in French Application 12 01432, filed May 21, 2012 (with English Translation of Category of Cited Documents).

*Primary Examiner* — Jermele M Hollington
*Assistant Examiner* — Christopher McAndrew
(74) *Attorney, Agent, or Firm* — Oblon, McClelland, Maier & Neustadt, L.L.P.

(57) ABSTRACT

The invention relates to a mixed current sensor comprising in a case:
  a magnetic current sensor;
  a current measuring device comprising a Rogowski coil arranged in such a way that a primary circuit of the magnetic sensor corresponds to the primary circuit of said current measuring device,
  electronic means for performing acquisition and measurement of the electric current.
Said sensor comprises a linking cassette comprising
  first fixing means arranged to position and secure said cassette by clip-fastening onto the measuring device;
  second fixing means arranged to position and secure said cassette and the measuring device by clip-fastening onto the case.

9 Claims, 5 Drawing Sheets

(51) Int. Cl.
  *G01R 3/00* (2006.01)
  *G01R 15/20* (2006.01)
  *G01R 33/02* (2006.01)
  *G01R 33/00* (2006.01)

(56) References Cited

U.S. PATENT DOCUMENTS

| | | | | |
|---|---|---|---|---|
| 3,041,564 A * | 6/1962 | Peterson | H01F 27/40 | 336/192 |
| 4,414,510 A * | 11/1983 | Milkovic | H01L 43/10 | 257/E43.005 |
| 4,647,844 A * | 3/1987 | Biegon | G01R 31/021 | 324/627 |
| 4,709,205 A * | 11/1987 | Baurand | G01R 15/181 | 324/127 |
| 4,937,546 A * | 6/1990 | Horng | H01F 5/04 | 336/192 |
| 5,223,790 A * | 6/1993 | Baran | H01F 38/30 | 324/117 R |
| 5,418,514 A * | 5/1995 | Smith | H01F 38/30 | 336/210 |
| 5,644,238 A * | 7/1997 | Seifert | G01R 19/30 | 324/132 |
| 5,982,265 A * | 11/1999 | Von Skarczinski | H01F 38/30 | 336/174 |
| 6,008,711 A * | 12/1999 | Bolam | H01F 38/30 | 324/107 |
| 6,018,239 A * | 1/2000 | Berkcan | G01R 15/181 | 324/127 |
| 6,280,858 B1 * | 8/2001 | Teshima | B23K 35/262 | 257/E23.023 |
| 6,313,623 B1 * | 11/2001 | Kojovic | G01R 15/181 | 324/127 |
| 6,429,640 B1 * | 8/2002 | Daughton | E82Y 25/00 | 324/117 R |
| 6,437,555 B1 * | 8/2002 | Pioch | G01R 15/181 | 324/117 R |
| 6,825,650 B1 * | 11/2004 | McCormack | G01R 22/065 | 324/126 |
| 7,078,888 B2 * | 7/2006 | Budillon | G01R 15/181 | 324/117 H |
| 7,129,692 B2 * | 10/2006 | Omura | G01R 31/315 | 324/117 R |
| 7,816,905 B2 * | 10/2010 | Doogue | G01R 15/207 | 324/117 H |
| 7,839,605 B2 * | 11/2010 | Parker | G01R 33/04 | 360/318 |
| 8,049,494 B2 * | 11/2011 | Lepage | G01N 27/9013 | 324/222 |
| 8,928,337 B2 * | 1/2015 | Kesler | G01R 3/00 | 16/224 |
| 2005/0156587 A1 * | 7/2005 | Yakymyshyn | G01R 15/207 | 324/117 R |
| 2005/0253573 A1 * | 11/2005 | Budillon | G01R 15/181 | 324/126 |
| 2008/0007249 A1 * | 1/2008 | Wilkerson | G01R 15/181 | 324/127 |
| 2009/0168307 A1 * | 7/2009 | Loy | G01R 22/065 | 361/659 |
| 2009/0190289 A1 * | 7/2009 | Bellotto | H01H 71/7409 | 361/620 |
| 2009/0251316 A1 * | 10/2009 | Mamourian | G08B 3/10 | 340/540 |
| 2010/0066350 A1 * | 3/2010 | Matsumura | G01R 15/207 | 324/120 |
| 2010/0148901 A1 * | 6/2010 | Powell | H01F 27/06 | 336/65 |
| 2010/0156394 A1 * | 6/2010 | Ausserlechner | G01R 33/075 | 324/144 |
| 2010/0259275 A1 * | 10/2010 | Grieshaber | H01H 33/26 | 324/522 |
| 2011/0043190 A1 * | 2/2011 | Farr | G01R 15/181 | 324/126 |
| 2011/0109301 A1 * | 5/2011 | Johnson | H01R 13/6633 | 324/119 |
| 2012/0001645 A1 * | 1/2012 | Javora | G01R 15/142 | 324/658 |
| 2012/0046799 A1 * | 2/2012 | Alex | G01R 15/142 | 700/298 |
| 2012/0256617 A1 * | 10/2012 | Moreux | G01R 15/181 | 324/126 |
| 2013/0285825 A1 * | 10/2013 | Peczalski | G01R 33/07 | 340/664 |

* cited by examiner

MIXED CURRENT SENSOR AND METHOD FOR FITTING SAID SENSOR

BACKGROUND OF THE INVENTION

The invention relates to a mixed current sensor comprising in a case a magnetic current sensor having a coil wound around a magnetic circuit and a current measuring device comprising a Rogowski coil arranged in such a way that a primary circuit of the magnetic sensor corresponds to the primary circuit of said current measuring device. The mixed current sensor comprises electronic means for performing acquisition and measurement of the electric current, said means being supplied by the coil of the magnetic sensor.

The invention also relates to a method for fitting the mixed current sensor.

STATE OF THE ART

The use of a current measuring device comprising inductive sensors of Rogowski type is extensively described in the literature.

Rogowski current measurement devices comprise a support made from non-magnetic material placed around a current conductor or line in which the current to be measured is flowing. A conducting wire is wound onto the support to form a secondary winding. The assembly forms a transformer where said current conductor or line constitutes a primary winding and said secondary winding provides a measurement signal. The voltage provided at the terminals of the secondary winding is directly proportional to the intensity of the electric current flowing in the current conductor or line. The absence of a magnetic core that is liable to be saturated enables a large measurement range to be achieved.

Certain solutions (U.S. Pat. No. 4,611,191, WO01/57543 A1) comprise coils in the form of torus-shaped solenoids. The electric wire can then be coiled onto a torus-shaped non-conducting support of circular or rectangular cross-section. Although they are very efficient, solutions using a closed torus remain difficult to industrialize due to the geometry of the torus. Problems of fitting the coils on their support are furthermore encountered.

SUMMARY OF THE INVENTION

The object of the invention is therefore to remedy the drawbacks of the state of the art so as to propose an electric current measuring device wherein industrialization of the latter is simplified.

The mixed current sensor according to the invention comprises a linking cassette comprising first fixing means arranged to position and secure said cassette by clip-fastening onto a measuring device and second fixing means arranged to position and secure said cassette and the measuring device by clip-fastening onto the case. Said sensor further comprises electric pins respectively connected to the Rogowski coil and to the electronic acquisition means.

According to a development mode of the invention, the Rogowski coil is composed of an insulating shell on which a metal wire is wound, said insulating shell comprising clip-fastening means designed to collaborate with the first fixing means of the linking cassette.

Advantageously, the clip-fastening means of the shell and the first fixing means of the linking cassette form a system of mortise and tenon type.

According to a development mode of the invention, the second fixing means comprise at least one centring and fixing pin to position and secure the linking cassette and the measuring device by clip-fastening on the case.

Preferably, the case comprises a base comprising a first housing for the electronic acquisition and measuring means, one of the walls of said housing comprising an opening for passage of the linking cassette.

Advantageously, the case comprises a first cover designed to be fixed by soldering onto the outer edges of the walls of the first housing of the base.

Advantageously, the electronic means comprise a printed circuit board arranged so as to be positioned inside the walls of the housing, the printed circuit board comprising holes enabling the electric pins of the linking cassette to be engaged and to pass through.

Preferably, the base comprises a second housing having walls inside which the magnetic current sensor and the current measuring device are positioned.

Advantageously, the case comprises a second cover designed to be fixed by soldering onto the outer edges of the walls of the second housing of the base.

The magnetic current sensor is connected to the electronic means for performing acquisition and management of the electric current by rigid electric tracks securedly attached to the base.

The invention relates to a method for fitting a mixed current sensor as defined above. The method according to the invention comprises the following steps:
 fixing of the linking cassette on the insulating shell of the current measuring device, the wires of the coil being electrically connected to electric pins of the cassette;
 positioning of the assembly formed by the linking cassette and coiled shell in the housing of the base of the case, two centring pins of the cassette enabling positioning and securing of the cassette and of the measuring device by clip-fastening onto the case;
 fixing of the magnetic current sensor in the base of the case;
 electric soldering of the electric tracks on the coil of the magnetic sensor;
 positioning of the printed circuit board of the electronic acquisition means inside the walls of the first housing;
 soldering of the electric pins of the cassette and of the electric pins of the electric tracks onto the electronic acquisition means;
 positioning and soldering of a first cover on the outer edges of the walls of the first housing;
 positioning and soldering of a second cover on the outer edges of the walls of the second housing of the base.

Advantageously, the electric pins of the linking cassette and the electric pins of the electric tracks are soldered onto the electronic acquisition means by laser tin brazing.

BRIEF DESCRIPTION OF THE DRAWINGS

Other advantages and features will become more clearly apparent from the following description of a particular embodiment of the invention, given for non-restrictive example purposes only, and represented in the appended diagrams in which.

DETAILED DESCRIPTION OF AN EMBODIMENT

Figure 1:
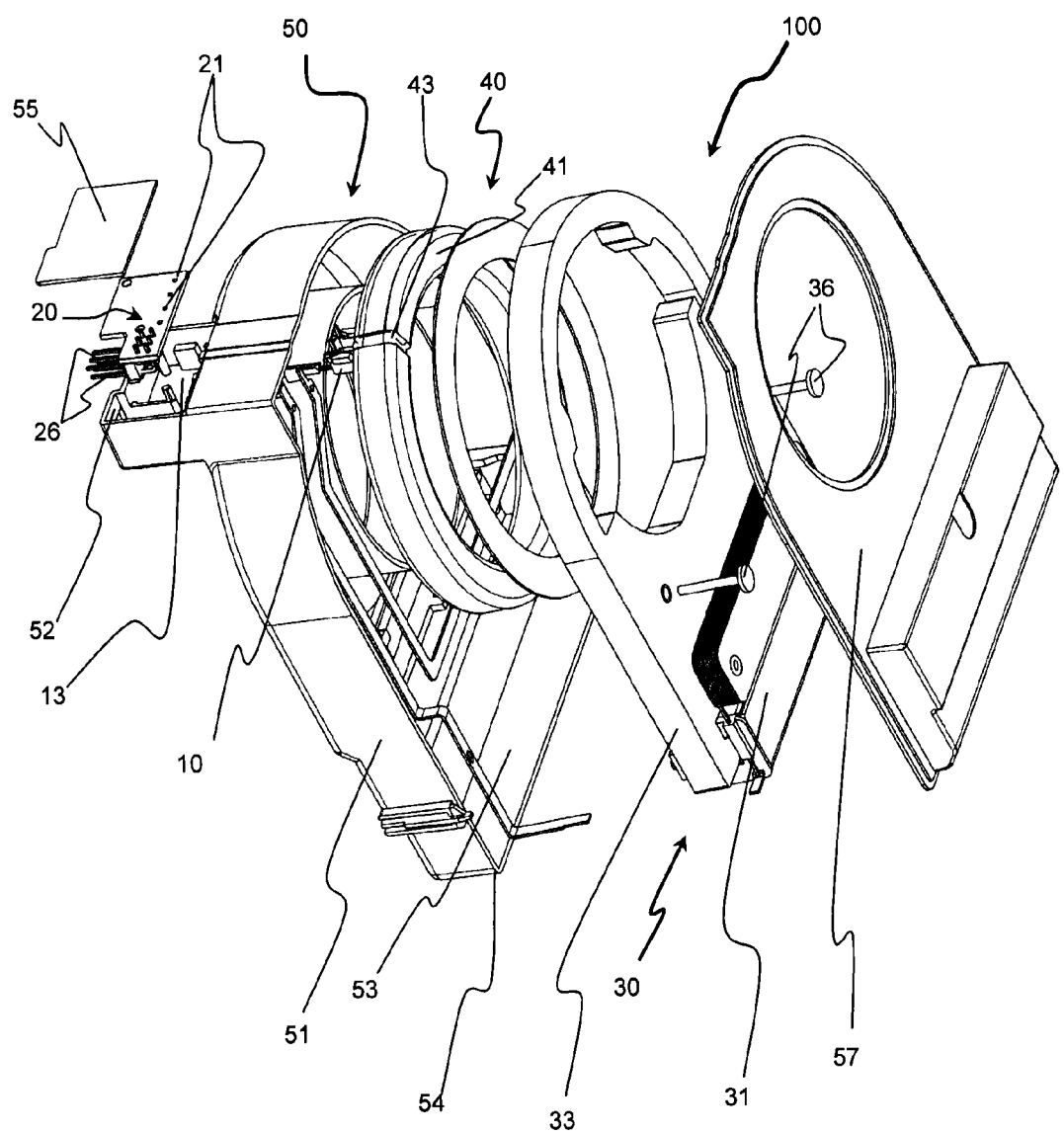
FIG. 1 presents an exploded view of a mixed electric current sensor according to a preferred embodiment of the invention.
Figure 2:
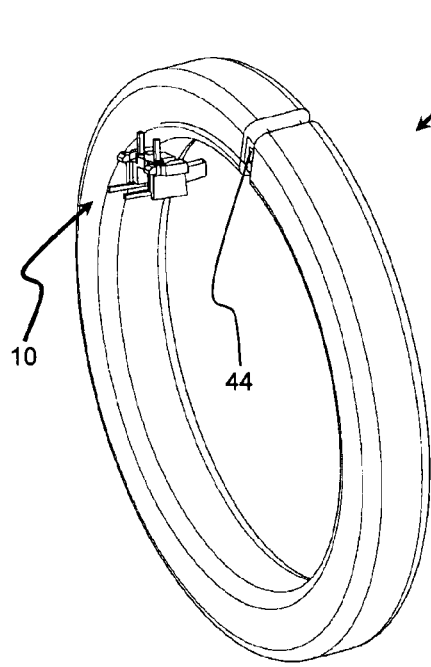
FIG. 2 represents an exploded view of a current measuring device of a mixed electric current sensor according to FIG. 1.
Figure 3:
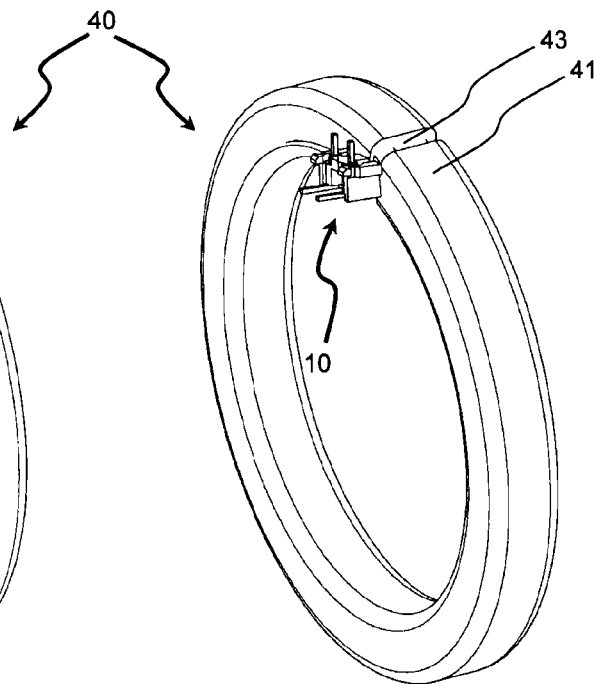
FIG. 3 represents a perspective view of a current measuring device of a mixed electric current sensor according to FIG. 1.

According to a preferred embodiment as represented in FIG. 1, the mixed current sensor 100 comprises a magnetic current sensor 30 and a current measuring device 40 assembled in a case 50.

The magnetic current sensor 30 comprises a coil 31 wound around a magnetic circuit 33.

The current measuring device 40 comprises a Rogowski coil 41 arranged in such a way that a primary circuit of the magnetic sensor 30 corresponds to the primary circuit of said current measuring device 40. The Rogowski coil 41 is composed of an insulating shell 44 onto which a metal wire is wound. As an example embodiment, said shell 43 is of circular, hollow shape, made from rigid or semi-rigid non-magnetic material, preferably of cylindrical or oval cross-section. The metal wire wound onto the shell 43 is preferably made from copper or a copper-based alloy.

The case 50 is provided with a central recess 90 enabling passage of the current conductor or line 80 on which the current measurement is made. This current conductor or line forms the primary circuit of the current measuring device 40.

Figure 7:
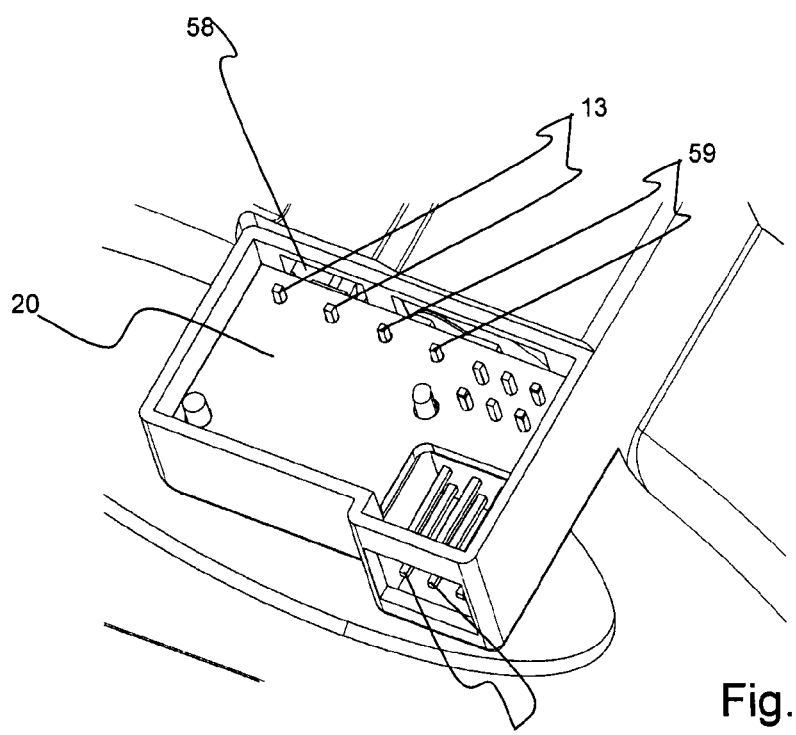
FIG. 7 represents a perspective view of the electronic means for performing acquisition and measurement of the electric current of a current measuring device of a mixed electric current sensor according to FIG. 1.

As represented in FIGS. 1 and 7, the mixed current sensor 100 comprises electronic means 20 for performing acquisition and measurement of the electric current. Said means are supplied by the coil 31 of the magnetic sensor 30.

According to an embodiment as represented in FIGS. 2 to 7, the mixed current sensor 100 comprises a linking cassette 10 comprising first and second linking means 11, 12.

The case 50 comprises a base 51 comprising a first housing 52 for the electronic acquisition and measurement means 20, one of the walls of said housing comprising an opening 58 for passage of the linking cassette 10.

The first fixing means 11 are arranged to position and secure said cassette by clip-fastening on the current measuring device 40. The object of the invention is to be able to fix the linking cassette 10 onto the measuring device 40 in a reproducible position thereby facilitating fitting of the mixed current sensor 100.

The insulating shell 43 of the Rogowski coil 41 then comprises clip-fastening means 44 designed to collaborate with the first fixing means 11 of the linking cassette 10.

The clip-fastening means 44 of the shell 43 and the first fixing means 11 of the linking cassette 10 form a system of tenon and mortar type. This link does however preferably present a functional clearance to absorb the different coil heights and so as to prevent tensions on the wires.

The second fixing means 12 of the linking cassette 10 are arranged to position and secure said cassette and the measuring device 40 by clip-fastening onto the case 50. The object of the invention is to be able to fix the assembly formed by a linking cassette 10 and the measuring device 40 to the case 50 in a reproducible position thereby facilitating fitting of the mixed current sensor 100.

Figure 4:
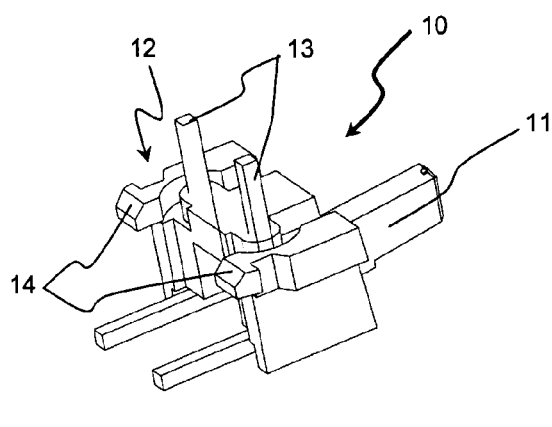
FIGS. 4 and 5 represent detailed perspective views of an embodiment of the current measuring device according to FIG. 3.
Figure 5:
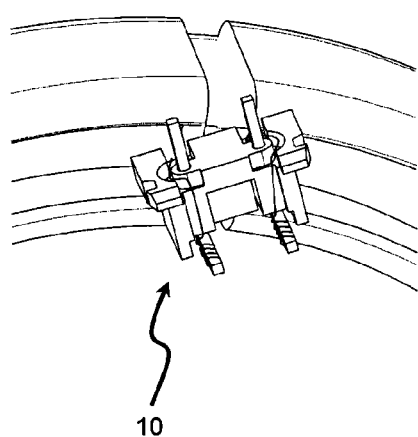
Figure 6:
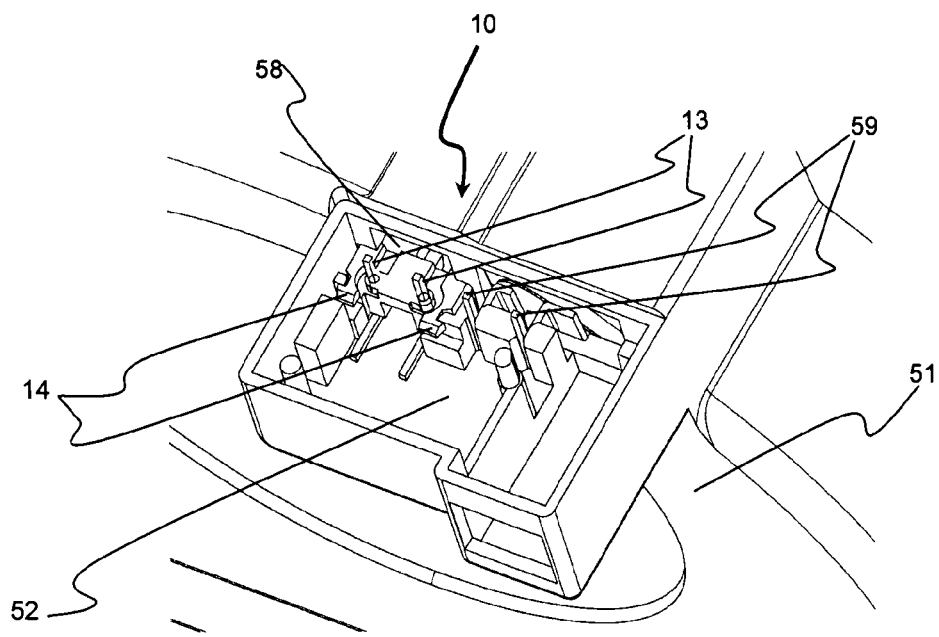
FIG. 6 represents a detailed view of a current measuring device of a mixed electric current sensor according to FIG. 1.

As an example embodiment as represented in FIGS. 4 and 5, the second fixing means 12 comprise at least one centring and fixing pin 14 to position and secure the cassette 10 and measuring device 40 by clip-fastening onto the case 50. The second fixing means preferably comprise two centring pins 14 enabling the assembly formed by the cassette and measuring device to be fitted in a housing 52 of the base 51 of the case 50.

The linking cassette 10 comprises electric pins 13 respectively connected to the coil 41 and to the electronic acquisition means 20. As an example embodiment, the electric pins 13 are soldered to the electric acquisition means 20. An automated soldering process by laser tin brazing can be used. The electronic acquisition means also preferably comprise connection studs designed to be connected to a connector.

As represented in FIG. 7, the electronic means 20 comprise a printed circuit board arranged to be positioned inside the walls of the first housing 52. Said printed circuit board comprises holes 21 enabling the electric pins 13 of the linking cassette 10 to be engaged and to pass through. The case 50 comprises a first flat cover 55 designed to be fixed by soldering onto the outer edges of the walls of the first housing 52 of the base 51. The outer edges of the walls of the first housing 52 preferably develop along a plane.

The case comprises a base 51 comprising a second housing 53 having walls inside which the magnetic current sensor 30 and the current measuring device 40 are positioned.

Figure 8:
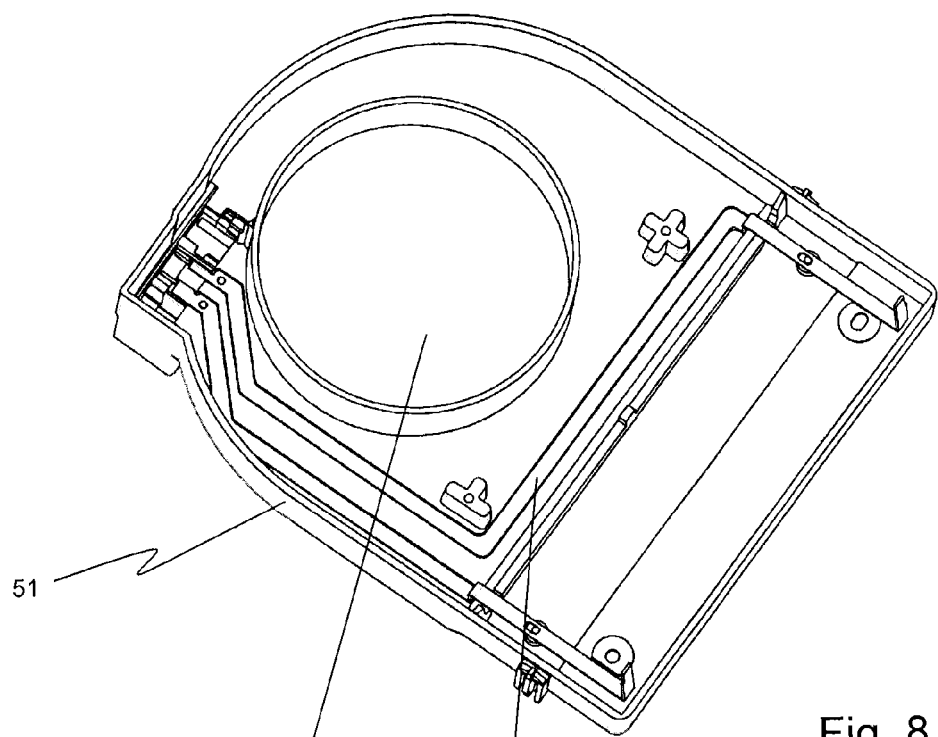
FIGS. 8 and 9 represent perspective views of a mixed electric current sensor in the course of assembly according to FIG. 1.
Figure 9:
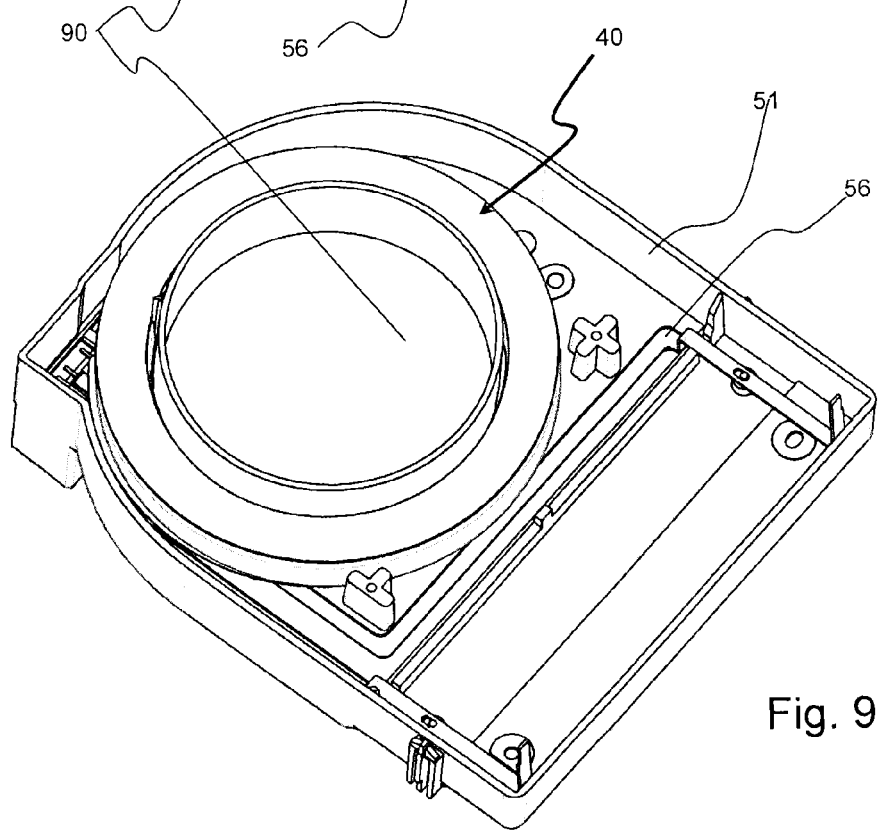

According to a preferred embodiment as represented in FIGS. 8 and 9, the outer edges 54 of the walls are developed in a plane. The case 50 comprises a flat second cover 57 designed to be secured by soldering onto the outer edges 54 of the walls of the second housing 53 of the base 51.

The magnetic current sensor 30 is connected to the electronic means 20 for performing acquisition and measurement of the electric current by rigid electric tracks 56 securedly attached to the base 51. The electric tracks comprise pins 59 at their ends. An automated soldering process by laser tin brazing can be used for soldering said pins 59 of the electric tracks 56 to the printed circuit board of the electronic acquisition means 20.

The invention also relates to a method for fitting a mixed current sensor as defined above. The method consists in a first step in fixing the cassette 10 onto the insulating shell 43 of the current measuring device 40. The wires of the Rogowski coil 41 are electrically connected to electric pins 13 of the cassette 10.

In a second step, the assembly formed by the linking a cassette 10 and the coiled shell 43 is then positioned and fixed in the first housing 52 of the base of the case 50. According to this embodiment, two centring pins 14 of the linking cassette 10 enable positioning and fixing by clip-fastening of said cassette 10 and of the measuring device 40 onto the case 50.

The following step consists in fixing the magnetic current sensor 30 in the base of the case 50. Fixing means 36 enable the magnetic sensor 30 and the current measuring device 40 to be secured to the base of the case 50. An electric connection is made between the electric tracks 56 and the coil 31 of the magnetic sensor 30. The connection can also be made for example by electric soldering.

According to one embodiment, the fixing means 36 are unable to be removed and can be presented in the form of nails. By means of this type of fixing means, the usual use of a compensating seal is not useful for securing the magnetic sensor 30 and current measuring device 40.

The printed circuit board of the electronic acquisition means 20 is then positioned inside the walls of the first housing 52. The electric pins 13 of the linking cassette 10 pass through holes 21 present on the circuit. The electric pins 59 of the electric tracks 56 also pass through holes 21 of said circuit. All the electric pins 13, 59 are then preferably soldered by an automated soldering process by laser tin brazing. A first cover 55 is then positioned on the outer edges of the walls of the first housing 52. The outer edges preferably develop in a plane. The first cover 55 developing in a plane is then soldered onto said edges.

In a last step a second cover 57 is positioned on the outer edges 54 of the walls of the second housing 53 of the base 51. The second cover developing in a plane is then soldered onto said outer edges 54.

Figure 10:
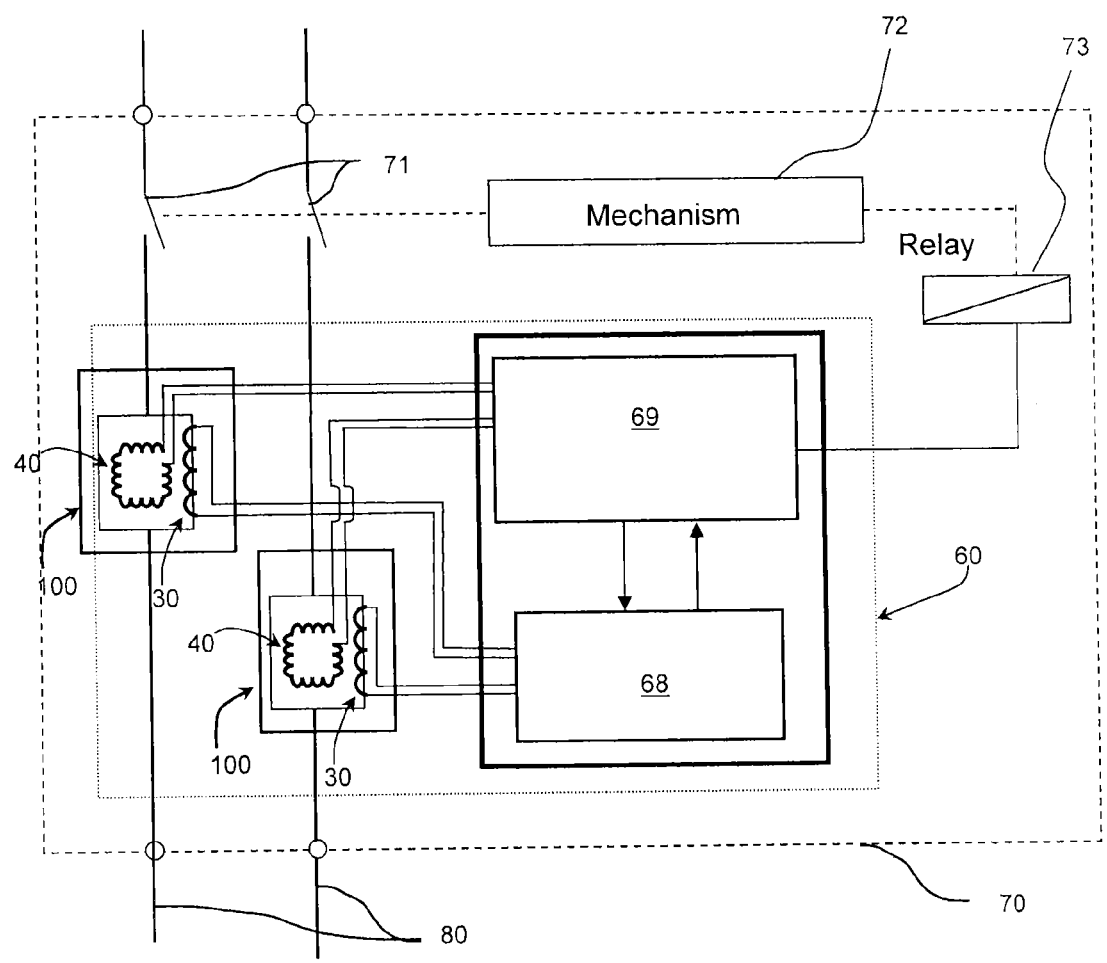
FIG. 10 represents an operating diagram of a switchgear device according to an embodiment of the invention and comprising a mixed electric current sensor according to FIG. 1.

As represented in FIG. 10, one or more mixed current sensors 100 can then be integrated in an electric trip device 60 designed to command a switchgear device 70 such as a circuit breaker. The circuit breaker 70 is fitted on electric current conductors or lines 80. The switchgear device 70 comprises an opening mechanism 72 of electric contacts 71.

The magnetic current sensors 30 are then connected to the general power supply case 68 of the trip device 60. The power supply means 68 are thus connected to said mixed current sensor 100 to receive at least one power supply signal.

The current measuring devices 40 according to the invention are connected to the general processing means 69. The processing means 69 are thus connected to said mixed current sensor 100 to receive at least one signal representative of a primary current flowing in the lines 80.

The general processing means 69 are themselves supplied by the general power supply case 68. As represented in FIG. 10, several electric poles of an installation can each comprise a mixed current sensor 100 comprising a magnetic current sensor 30 and a current measuring device 40. If the general processing means 69 receive via the current measuring devices 40, information of a fault present on one of the lines 80, a command order to perform opening of the contacts 71 can be sent to the opening mechanism 72 via a relay 73.

The invention claimed is:

1. A mixed current sensor secured within a case, the case comprising a base including a first housing and a second housing, the mixed current sensor comprising:
   a magnetic current sensor having a coil wound around a magnetic circuit;
   a current measuring device comprising a Rogowski coil arranged in such a way that a primary circuit of the magnetic sensor corresponds to the primary circuit of said current measuring device, the magnetic current sensor and the current measuring device being positioned inside walls of the second housing and being covered by a second cover on outer edges of the walls of the second housing;
   an electronic-printed circuit that acquires and measures electric current, said electronic printed circuit being supplied with the electric current from the coil of the magnetic current sensor, being positioned inside walls of the first housing and being covered by a first cover on outer edges of the walls of the first housing; and
   a linking cassette including
      a first fixing arranged to position and secure said linking cassette by clip-fastening the linking cassette onto the current measuring device without soldering;
      a second fixing arranged to position and secure said linking cassette and the current measuring device by clip-fastening the linking cassette within the case without soldering; and
      electric pins respectively connected to the Rogowski coil and to the electronic printed circuit to acquire and measure the electric current, wherein
      electric tracks are securely attached to the base and electrically soldered onto the coil of the magnetic current sensor, and the electric tracks connect the magnetic current sensor to the electronic printed circuit.

2. The mixed current sensor according to claim 1, wherein the Rogowski coil is composed of an insulating shell on which a metal wire is wound, said shell comprising clip-fastening means designed to collaborate with the first fixing.

3. The mixed current sensor according to claim 2, wherein the clip-fastening and the first fixing together form a system of mortise and tenon type.

4. The mixed current sensor according to claim 1, wherein the second fixing comprises at least one centering and fixing pin to position and secure the linking cassette and the current measuring device by clip-fastening to the case.

5. The mixed current sensor according to claim 1, wherein one of the walls of said first housing comprising an opening for passage of the linking cassette.

6. The mixed current sensor according to claim 5, wherein the electronic printed circuit comprises a printed circuit board that is positioned inside the walls of the housing, and the printed circuit board comprises holes through which the electric pins of the linking cassette is engaged and pass through.

7. The mixed current sensor according to claim 5, wherein the magnetic current sensor is connected to the electronic printed circuit for performing acquisition and management of the electric current by rigid electric tracks securedly attached to the base.

8. A method for fitting a mixed current sensor into a case, the mixed current sensor comprising a magnetic current sensor having a coil wound around a magnetic circuit, a current measuring device having a Rogowski coil, an electronic printed circuit that acquires and measures electric current, and a linking cassette including a first fixing, a second fixing and electric pins, the case comprising a base including a first housing for the electronic printed circuit and a second housing for the magnetic current sensor and the current measuring device, said method comprising:
   fixing the linking cassette on an insulating shell of the current measuring device without soldering, wherein the Rogowski coil is composed of the insulating shell on which metal wires are wound, said insulating shell comprising a clip-fastener that collaborates with the first fixing of the linking cassette, and the wires of the coil of the current measuring device being electrically connected to the electric pins of the linking cassette;
   positioning an assembly formed by the linking cassette and a coiled shell in the first housing of the base of the case, two centering pins of the linking cassette enabling positioning and securing of the linking cassette and of the current measuring device by clip-fastening the assembly onto the case without soldering;
   fixing the magnetic current sensor in the base of the case;
   electrically soldering electric tracks onto the coil of the magnetic current sensor, the magnetic current sensor being connected to the electronic printed circuit for acquiring and managing the electric current by the electric tracks securedly attached to the base;

positioning an electronic printed circuit board of the electronic printed circuit inside the walls of the first housing;

soldering the electric pins of the linking cassette and the electric pins of the electric tracks onto the electronic printed circuit board of the electronic printed circuit;

positioning and soldering a first cover on outer edges of walls of the first housing; and positioning and soldering a second cover on outer edges of walls of the second housing of the base.

9. The method for fitting according to claim 8, wherein the electric pins of the linking cassette and the electric pins of the electric tracks are soldered onto the printed circuit board of the electronic printed circuit by laser tin brazing.

* * * * *